United States Patent [19]
Watkins et al.

[11] Patent Number: 5,661,439
[45] Date of Patent: Aug. 26, 1997

[54] METHOD AND APPARATUS FOR CANCELLING PHASE NOISE

[75] Inventors: Grant H. Watkins, Dunkirk; Stephen P. Caldwell, Columbia; Matthew Martello, Parkton; John P. Muhlbaier, Joppa, all of Md.

[73] Assignee: Northrop Grumman Corporation, Los Angeles, Calif.

[21] Appl. No.: 680,287

[22] Filed: Jul. 11, 1996

[51] Int. Cl.[6] .............................. H03B 28/00; H03L 7/00
[52] U.S. Cl. ......................... 331/1 R; 331/9; 331/18; 331/74; 331/175
[58] Field of Search ........................ 331/1 R, 9, 18, 331/23, 53, 74–77, 175; 327/119, 123, 154, 156–159; 455/63, 67.6, 260, 296, 303–306, 310, 313; 375/296, 344, 346, 376

[56] References Cited

U.S. PATENT DOCUMENTS

| | | | |
|---|---|---|---|
| 4,890,071 | 12/1989 | Curtis | 331/18 X |
| 4,918,405 | 4/1990 | Herleikson | 331/18 X |
| 4,994,767 | 2/1991 | Hawkes | 455/63 X |
| 5,521,557 | 5/1996 | Yamashita et al. | 331/17 X |

*Primary Examiner*—David Mis
*Attorney, Agent, or Firm*—Walter G. Sutcliff

[57] ABSTRACT

A frequency oscillator and a frequency multiplier multiplying the signals from the oscillator contain inherent phase noise. A phase noise canceller removes phase noise, due to both the oscillator and the multiplier, by inserting a delay in one path and comparing phases of the delayed signal and the undelayed signal. This comparison may be either fed back to the tuning port of the oscillator or fed forward to a phase shifter which shakes off the phase noise. The delay may include a delay line, a cavity or any other suitable device which produces a phase shift. The phase noise canceller may also be designed to remove the total phase noise of the system, including additive phase noise from sources other than the oscillator and multiplier. The canceller may be calibrated and may be designed to reduce periodic response thereof.

20 Claims, 14 Drawing Sheets

FIG.1a
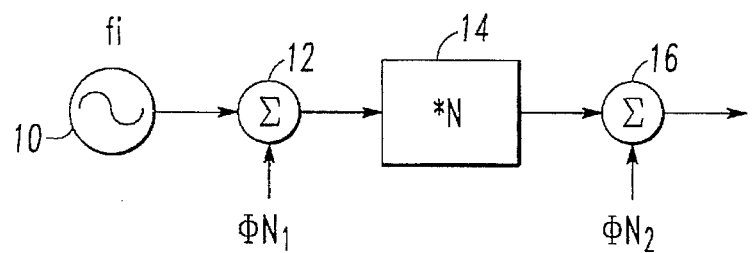
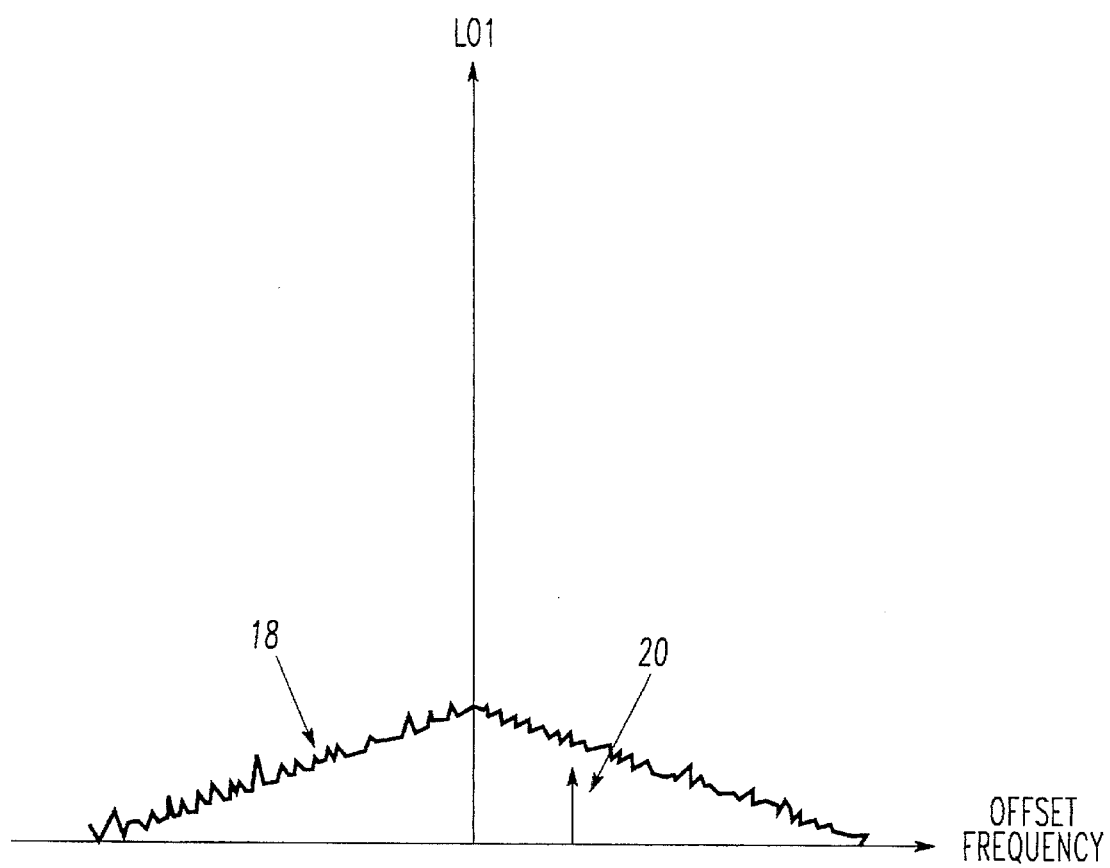
FIG.1b

FIG.2a
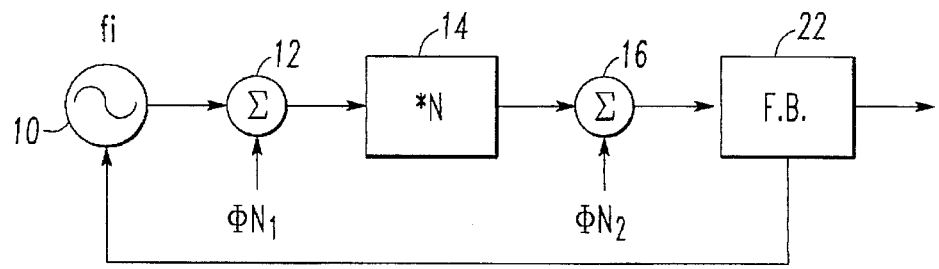
FIG.2b
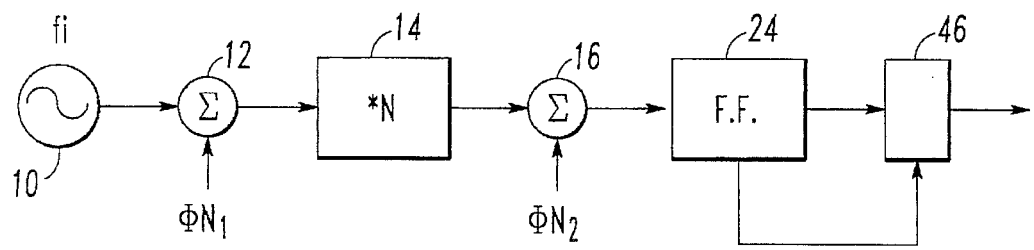
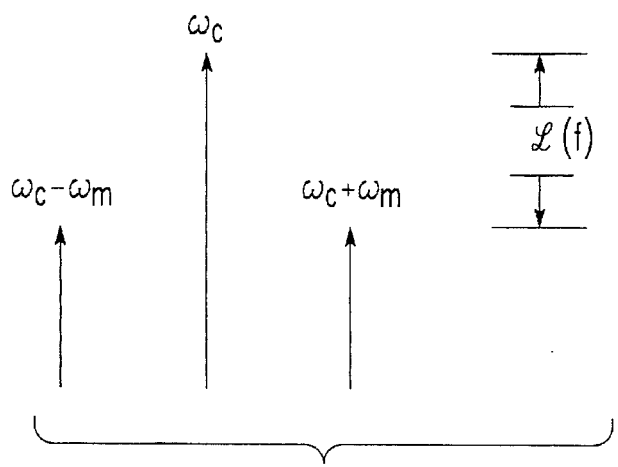
FIG.3

𝓛(f) [dBc/Hz] VS F[HZ]

𝓛(f) [dBc/Hz] VS F[HZ]

FIG.6a
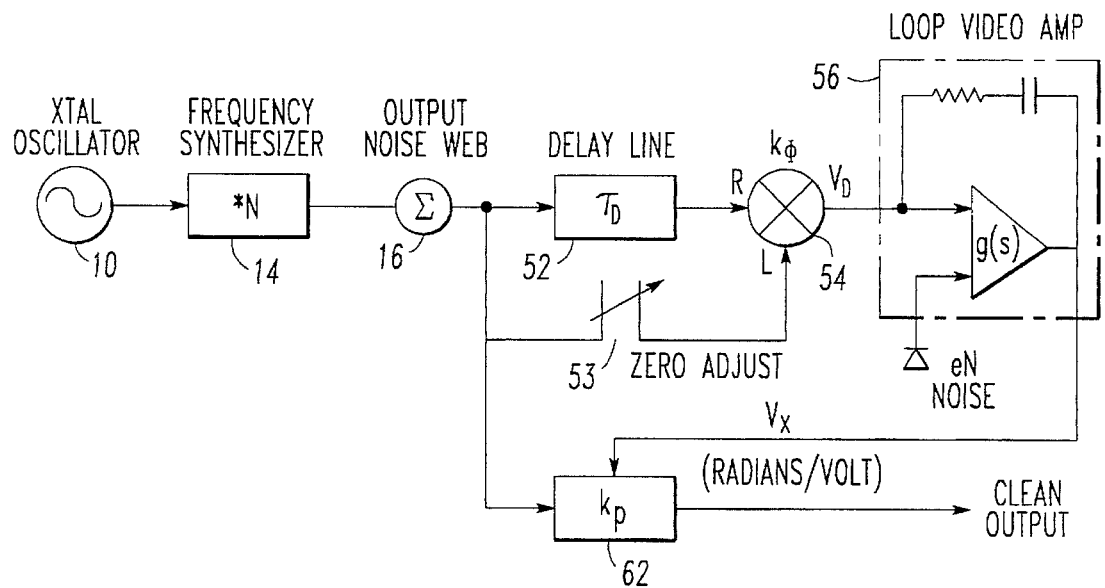
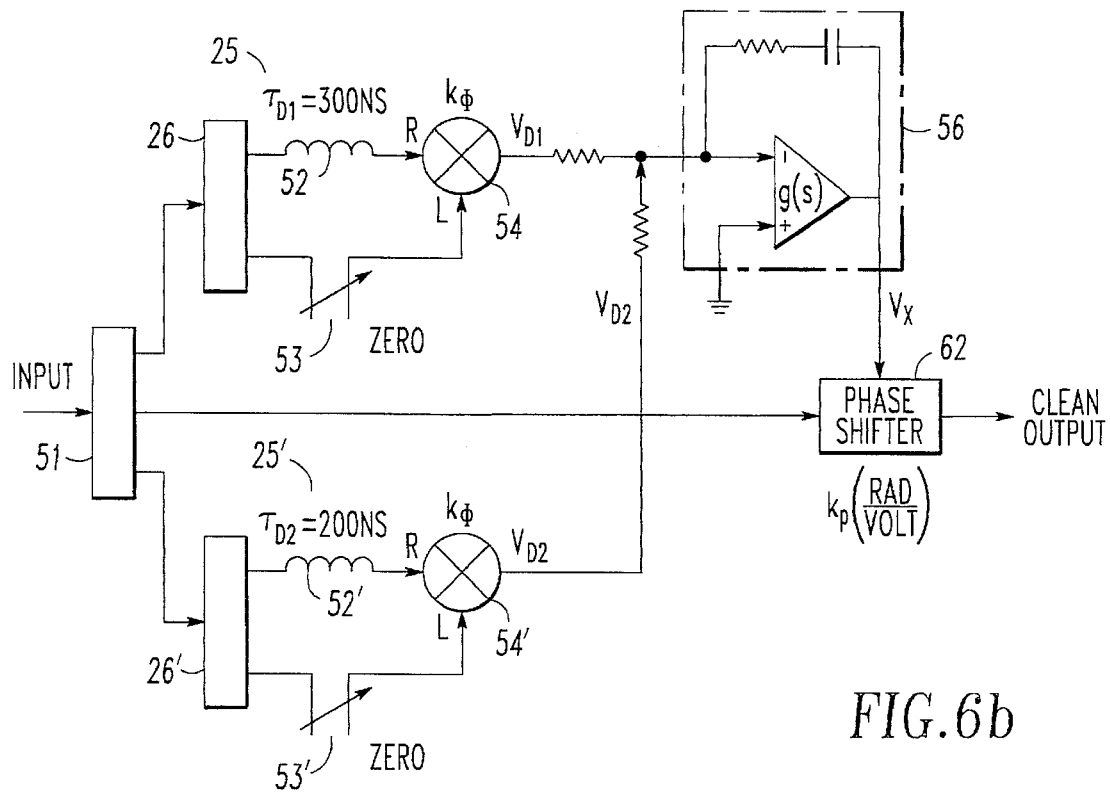
FIG.6b

FIG. 12
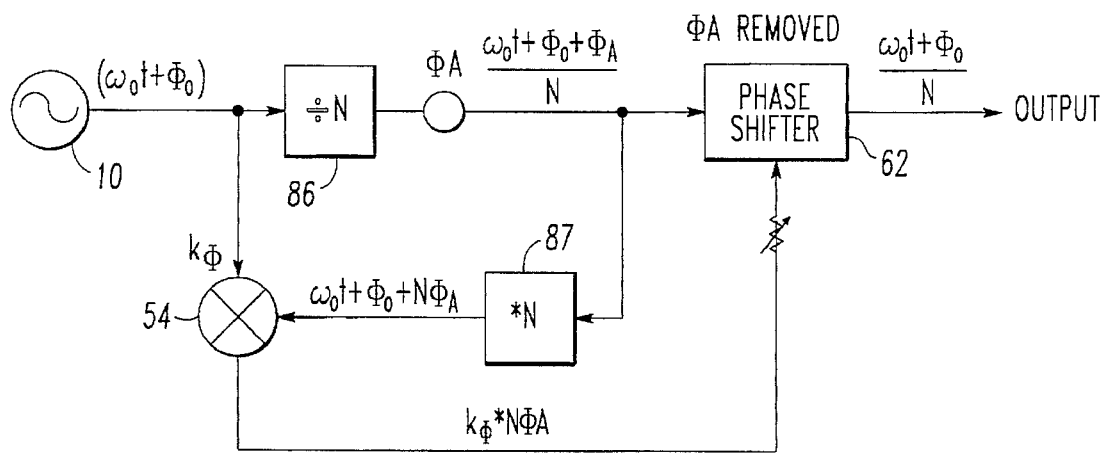
$\Phi_0$ = PHASE NOISE OF MASTER OSCILLATOR
$\Phi A$ = ADDITIVE PHASE NOISE OF FREQUENCY DIVIDER
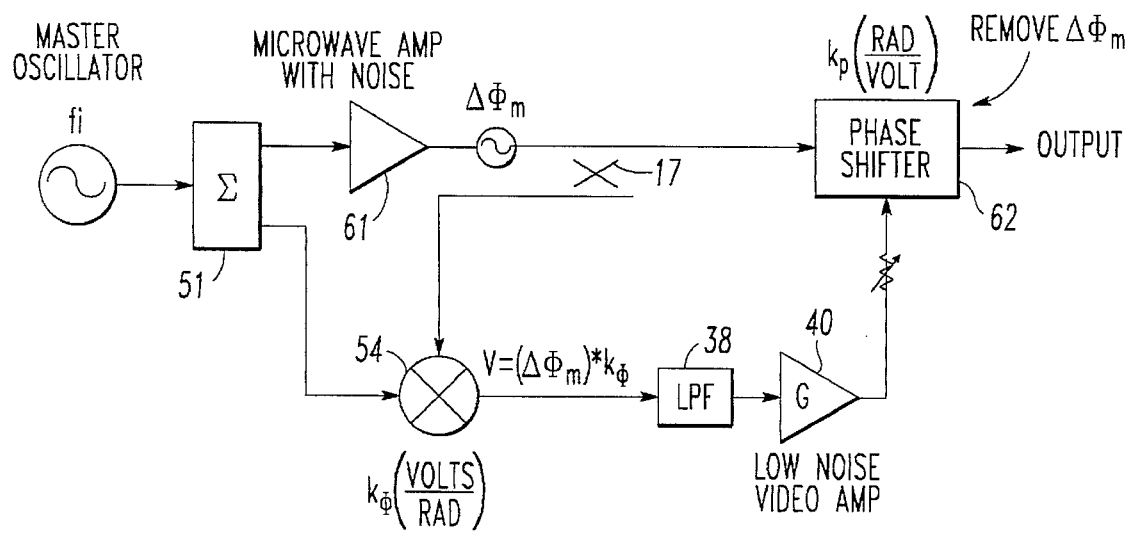
FIG. 13

METHOD AND APPARATUS FOR CANCELLING PHASE NOISE

BACKGROUND OF THE INVENTION

1. Field of the Invention

The present invention is directed to methods and apparatuses which improve phase noise performance of signal generation equipment requiring low phase-noise signal generators. In particular, the present invention is directed towards cancelling the phase noise of an entire system.

2. Description of the Related Art

Phase noise is a major limiting factor in determining, for example, radar dynamic range. The combination of a few ultra-low phase noise, state-of-the-art amplifiers exceeds present and future phase noise requirements for an entire STALO (stable local oscillator). However, every device included in a STALO makes a small addition to the total phase noise performance. When all small additions are combined, the radar dynamic range becomes limited.

FIG. 1a depicts the basic problem to which the present invention is directed. A frequency multiplier 14 of multiple N is driven by a master oscillator 10 of a frequency $f_i$ and of a phase noise spectrum $\phi N_1$, indicated at 12. At an output frequency of $N \times f_i$, the master oscillator noise spectrum is degraded by $N \times \phi N_1$. There are also numerous additive noise sources, whose total is represented by $\phi N_2$, indicated at 16. The additive noise $\phi N_2$ represents the sum of individual independent noise spectrums of any one of amplifiers, switches, frequency dividers, mixers, resistors and/or diodes. The total output noise spectrum is $N \times \phi N_1 + \phi N_2$.

Currently, attempts to reduce such noise output have focused on reducing noise from the respective sources, e.g., $\phi N_1$, components of $\phi N_2$ and N itself, but there are definite limits to which these parameters can be reduced.

FIG. 1b illustrates an example of the problem encountered by the configuration shown in FIG. 1a. In FIG. 1b, the plot 18 indicates the phase noise, or Halford noise, and the line 20 indicates the target return. The horizontal axis is the offset frequency and the vertical axis is the signal strength. Such phase noise occurs on an offset frequency range from 0.001 Hz to greater than 10 MHz from the desired signal. The amplitude of the phase noise typically decreases at a rate of 10 decibels per decade of offset frequency.

If such noise is transmitted on a radar signal, or present in the radar receiver local oscillator mixer port, this phase noise can cover up the desired doppler shifted radar return, thus preventing detection of the radar target.

When all of the small additions to phase noise from all of the sources noted above are combined, the radar dynamic range becomes limited, even when using signal generation equipment having improved phase noise. The present state of the art is limited by a summation of the many small contributions.

SUMMARY OF THE INVENTION

It is therefore an object of the present invention to provide a method and an apparatus for reducing phase noise of an entire system, without placing further constraints on the individual components of the system.

It is another object of the present invention to provide a system which can detect small signals.

It is yet another object of the present invention to eliminate phase noise from an oscillator, a multiplier and additive sources. It is a further object of the present invention to provide such a phase canceller which can be calibrated. The phase canceller may be designed to reduce periodic response. The phase canceller may be either of feed forward or feed back design.

These and other objects of the present invention will become more readily apparent from detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1a illustrates a block diagram of a conventional oscillator and multiplier circuit;

FIG. 1b is a plot of signal strength versus offset frequency typical for the configuration shown in FIG. 1a;

FIG. 2a illustrates a feed back canceller of the present invention;

FIG. 2b illustrates a feed forward canceller of the present invention;

FIG. 3 illustrates side bands produced by small signal phase modulation;

FIG. 4a illustrates a first embodiment of the feed back canceller of the present invention of FIG. 2a;

FIG. 4b illustrates a second embodiment of the feed back canceller of the present invention of FIG. 2a;

FIG. 4c illustrates a third embodiment of the feed back canceller of the present invention of FIG. 2a;

FIG. 6a illustrates a first embodiment of the feed forward canceller of FIG. 2b;

FIG. 6b illustrates a second embodiment of the feed forward canceller of FIG. 2b;

FIG. 12 illustrates a general configuration of a noise canceller for use with a frequency divider; and FIG. 13 illustrates a configuration for cancelling amplifier noise using a modified feed forward embodiment of FIG. 9.

DETAILED DESCRIPTION OF THE PREFERRED EMBODIMENTS

Figure 4A:
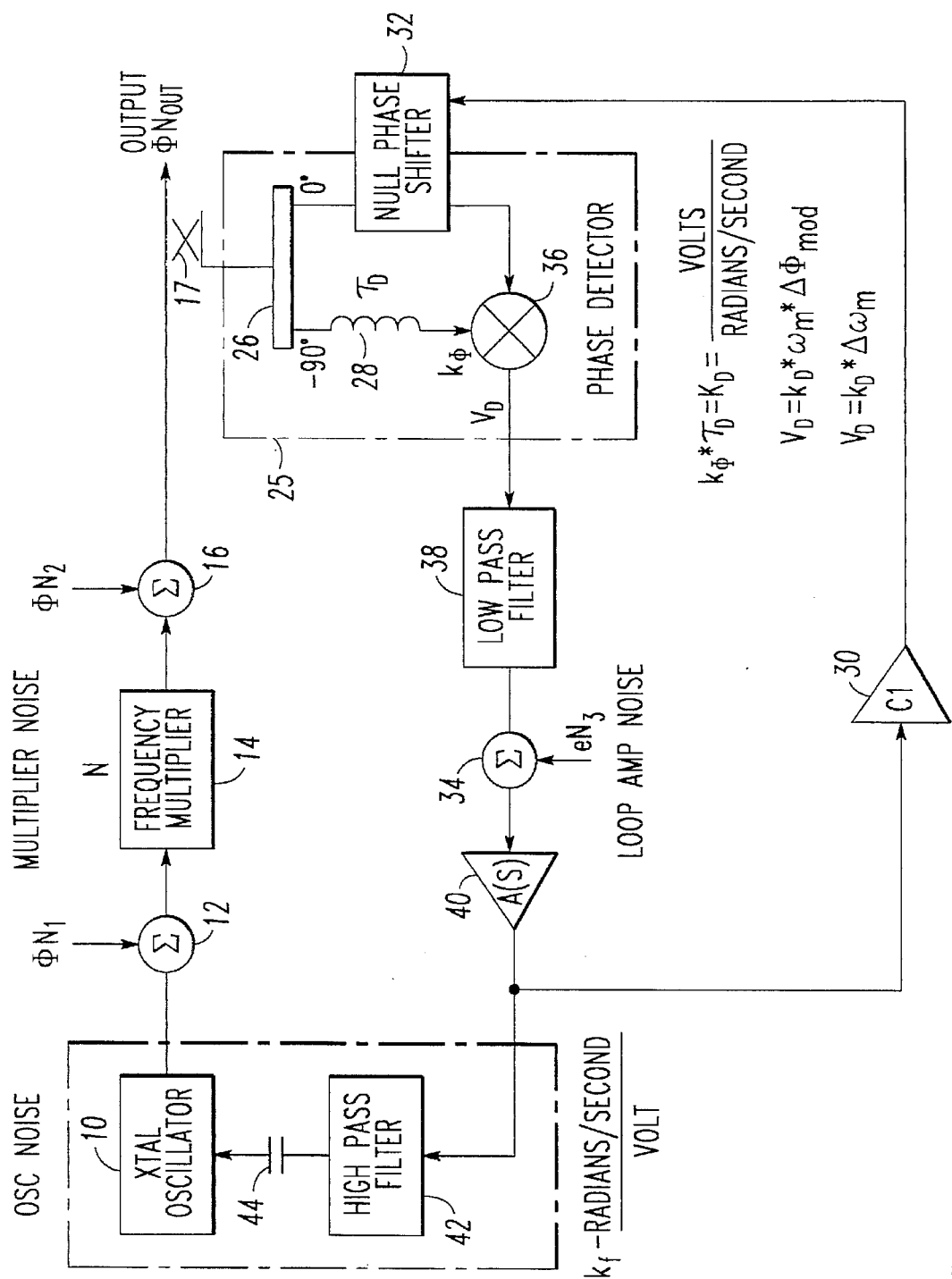

FIG. 2a is a block diagram of a first embodiment of the present invention, in which phase noise is cancelled using a feedback canceller 22. FIG. 2b is a block diagram in accordance with a second embodiment of the present invention, in which the phase noise is cancelled with a feed forward canceller 24. Each of these embodiments is described in detail below.

PHASE OR FREQUENCY NOISE GENERALLY

The type of noise the present invention is concerned with is frequency and phase modulation of very low frequency deviation. Amplitude modulated noise from the master oscillator 10 is minimized by the limiting action of the frequency multiplier 14. To facilitate analysis, small signal sinusoidal analysis of the phase modulation is used. The input angular frequency $\omega_i$, which is equal to $2\pi f_i$, is also equal to the following:

$$\omega_i = \omega_c + \alpha\omega\cos\omega_m t = d\phi/dt \qquad (1)$$

Thus, the carrier phase may be defined as:

$$\phi = \int \omega_i dt = \omega_c t + \frac{\Delta\omega}{\omega_m}\sin\omega_m t \qquad (2)$$

The modulation index B, in radians, is defined as:

$$B = \frac{\Delta\omega}{\omega_m} \qquad (3)$$

The carrier frequency $f_c$ is given by:

$$f_c(t) = \cos[\phi_c(t)] \qquad (4)$$

From equations (2) and (3):

$$f_c(t) = \cos(\omega_c t)\cos(B\sin\omega_m t) - \sin(\omega_c t)\sin(B\sin\omega_m t) \qquad (5)$$

For $B<<\pi/2$, $\cos(B\sin(\omega_m t)) \approx 1$ and $\sin(B\sin(\omega_m t)) \approx B\sin(\omega_m t)$. Thus, from equation (5) and known trigonometric relationships;

$$f_c(t) = \cos\omega_c t = \frac{B}{2}[\cos(\omega_c - \omega_m)t - \cos(\omega_c + \omega_m)t] \qquad (6)$$

In terms of complex functions:

$$f_c(t) = Re\left[e^{\omega_c t}\left(1 - \frac{B}{2}e^{j\omega_m t} + \frac{B}{2}e^{j\omega_m t}\right)\right] \qquad (7)$$

Thus, the frequency modulated side bands appear at $\omega_c \pm \omega_m$, as shown in FIG. 3.

For a small signal phase noise modulation side band from the output of the crystal oscillator 10, there is a corresponding frequency modulated side band: $\phi N_1 = \Delta\omega/\omega_m$, where $\Delta\omega$ is the frequency deviation and $\omega_m$ is the modulation frequency. The frequency multiplier is also a phase multiplier, i.e., the output phase noise from the multiplier is $N\phi N_1 = N\Delta\omega/\omega_m$.

The modulation frequency $\omega_m$ output by the oscillator 10 is not changed through the frequency multiplier 14. An FM side band at a frequency $\omega_m$ from the input frequency $\omega_0$ to a multiplier will appear at a frequency $\omega_m$ from $N\omega_0$ at the output. The modulation rate at the oscillator 10 is the same as the modulation rate of the multiplier 14. This can be seen in FIG. 3, in which the process of small signal frequency or phase modulation produces signal side bands on each side of the carrier with an offset frequency equal to the modulation frequency. As the frequency deviation increases, the level of the two side bands increases with the ratio of the carrier to the side band as defined by $\mathscr{L}(f)=20\log(\Delta\phi_m/2)$dB, where the modulation index $B=\Delta\phi_m=\Delta\omega/\omega_m$.

FEEDBACK LOOP CANCELLER

FIG. 4a shows a detailed diagram of a first embodiment in the noise cancelling circuit including a feedback loop as indicated in FIG. 2a. This circuit includes a crystal oscillator 10, outputting a phase noise $\phi_{N1}$ indicated at 12. A frequency multiplier 14 of multiple N receives the signal output from the oscillator 10 and multiplies the phase noise from the oscillator by N, as well as outputting its own associated phase noise $\phi_{N2}$, indicated at 12.

A directional coupler 17 couples the signal from the multiplier 14 to a frequency discriminator 25. The frequency discriminator 25 includes a power splitter 26 for dividing the signal coupled to the discriminator 25 by the coupler 17 along two paths. One path includes a delay line 28, which introduces a delay time of $T_D$. The other path includes a phase shifter 32. Signals from both paths are detected by a phase detector 36.

The output of the phase detector 36 is fed to a low pass filter 38. The phase noise from the loop amplifiers $eN_3$ is indicated at 34. An amplifier 40 amplifies the signal from the low pass filter 38. The amplified signal from the amplifier 40 is delivered both to a high pass filter 42 and to an offset correction amplifier 30. The high pass filter 42 delivers its output to an oscillator tuning port 44 which controls the frequency generated by the oscillator 10. The offset correction amplifier 30 delivers its output to the phase shifter 32. Thus, a feedback loop is formed.

The circuit in FIG. 4a is capable of suppressing noise generated by the crystal oscillator $\phi N_1$, by the frequency multiplier $\phi N_2$, and by the loop amplifier $eN_3$. The low frequency feedback loop formed by the offset correction amplifier 30 and the phase shifter 32 keeps the delay line discriminator 25 properly zeroed after an initial adjustment to compensate for long term drift. The output of the phase detector 36 $V_D$ is given by:

$$V_D = k_\phi \times \tau_D \times \Delta\omega \qquad (8)$$

where $k_\phi$ is a constant determined by the choice and drive level of the phase detector 36, $\Delta\omega$ is a frequency deviation, and $T_D$ is the delay time. Maintaining the DC output of the phase detector 36 within a few millivolts of zero will insure that the carrier is properly nulled and that the phase detector is operating at maximum sensitivity.

The total phase noise output of the configuration shown in FIG. 4a is given by the expression:

$$\phi N_{out} = [(N\times\phi_{N1})+\phi_{N2}+(EN_3\times A\times N\times k_f)]/(1+G) \qquad (9)$$

where G is the open loop gain with respect to phase, i.e., $G=N*A(s)*k_D(s)*k_f(s)$. As the offset frequency $\omega_m$ decreases, the noise de-correlation and $V_D$ output from the phase detector 36 become very small and the term $eN_3$ becomes significant. As frequency decreases, a point is reached at which the noise output from the loop amplifier exceeds the remaining noise output from the oscillator 10 and the multiplier 14. At this frequency, the feedback loop should be disconnected by action of the high pass filter 42.

To make a wide band feedback loop of several MHz, it is important to keep group delay around the loop to a minimum. The frequency multiplier 14 is wide band, and has some group delays determined by the number of internal multiple stages. The loop amplifier 40 can be made to have a minimal group delay. The group delay $k_f$ of the crystal oscillator 10 can be minimized by making a tuning bandwidth of the oscillator tuning port 44 very large. The group delay $k_D$ through the frequency discriminator is determined by the delay time through the short path, not through the delayed line path. A stable feedback loop of several MHz is possible.

Delay Line Discriminator

The delay line frequency discriminator 25 shown in FIG. 4a is suitable for use over large RF bandwidths if the bridge is kept nulled as the RF is stepped in increments. The detected voltage is in phase quadrature with the modulation voltage for all modulation frequencies $\omega_m$. The detected voltage increases linearly with $\omega_m$ for a constant phase modulation $\Delta\phi_m$. The response of the discriminator 25 is periodic.

The delay time $T_D$ is given, in seconds, by:

$$T_D = \Delta\phi/\Delta\omega \qquad (10)$$

The phase detector $k_\phi$ is given, in volts per radian, by:

$$k_\phi = \Delta V/\Delta\phi \qquad (11)$$

The phase discriminator $k_D$ is given in volts per radian/sec by:

$$k_D = \Delta V/\Delta\omega = T_D * k_\phi \qquad (12)$$

Thus, from equations (11) and (12), the output voltage $V_D$ is given in volts by:

$$V_D = \Delta V = k_D * \Delta\omega \qquad (13)$$

Thus, there is a 90° phase difference between $V_D$ and the phase modulation $\sin\omega_m t$.

For video offset frequencies in which G is greater than 1, the multiplied crystal oscillator noise $N\phi N_1$ and frequency multiplier noise $\phi N_2$ are reduced by (1+G). At such frequencies, the phase noise contributions from the loop amplifier become $eN_3/k_D$. Obviously, it is desired for $eN_3$ to be small and for $k_D$ to be large.

Figure 4B:
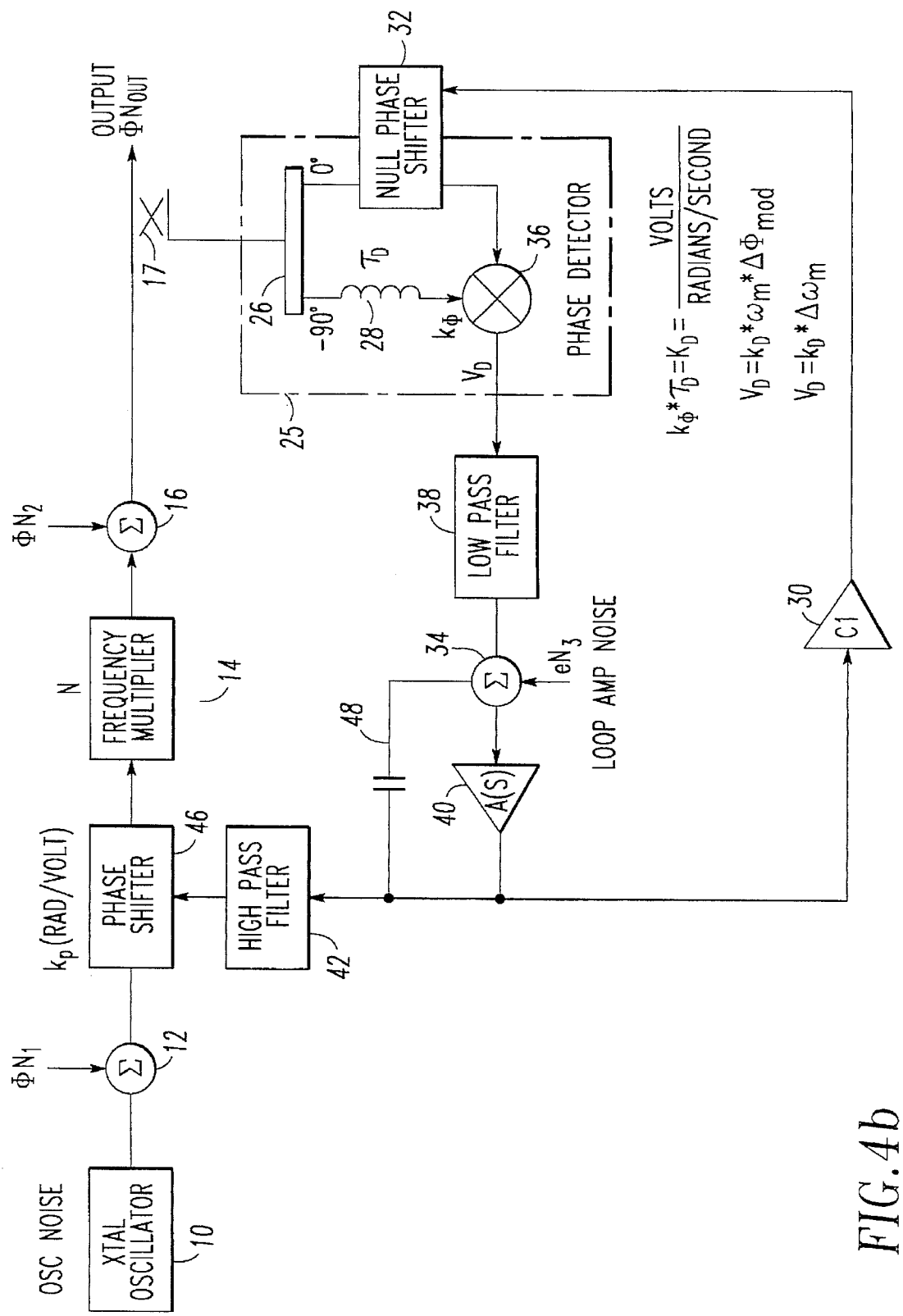

FIG. 4b shows the same noise canceller as shown in FIG. 4a, further including a phase shifter 46 of sensitivity $k_P$. The phase shifter 46 is used to shake off the multiplier noise and the multiplied oscillator noise. In order to establish a stable loop in such a configuration, an additional video integrator 48 is required to replace integration that was previously provided by the crystal oscillator tuning port 44 in FIG. 4a.

Cavity Discriminator

Figure 4C:
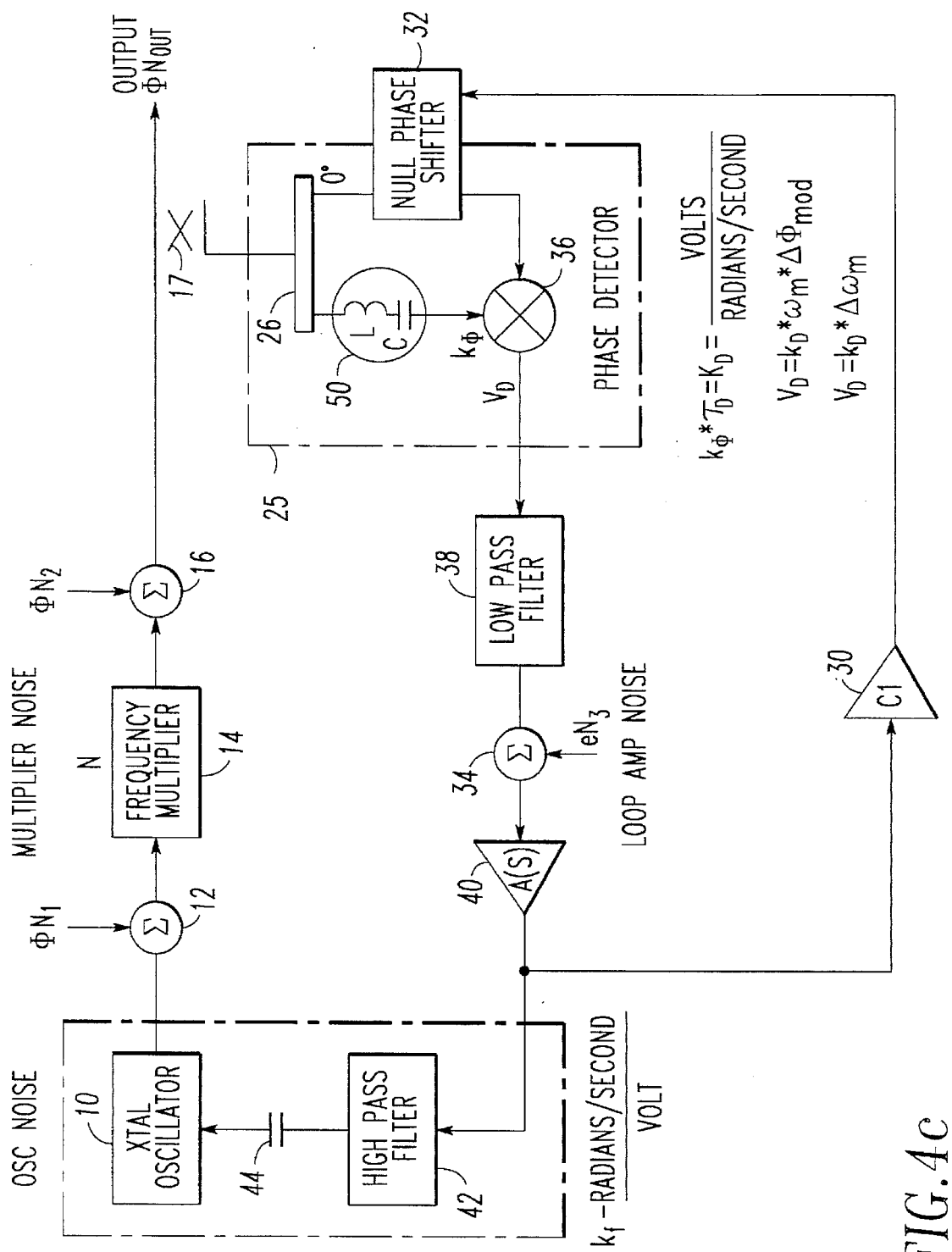

FIG. 4c shows a configuration similar to that in FIG. 4a, except that the delay line 28 of FIG. 4a has been replaced by a narrow band cavity 50, having an equivalent capacitance C and inductance L, with a feedback applied to the tuning port 44 of the master oscillator 10. For a single pole cavity at 10 GHz, a Q or quality factor of 100,000 can be obtained from an HTS resonator. Hence, such a screen will allow measurement of phase noise and also frequencies up to ±2 MHz from the carrier in the X band region. A multiple pole cavity with linear phase versus frequency will allow measurement to higher offset frequencies.

When using a cavity as the frequency discriminator, as shown in FIG. 4c, the relationship between the output voltage $V_D$ and the modulation voltage may be determined as follows. At $\omega=\omega_0$, the phase shift through the cavity $\Delta\omega_c=0°$. At $\omega=\omega_0+\Delta\omega$, the phase shift through the cavity $\Delta\omega_c=2Q\Delta\omega/\omega_0$. Since $\Delta\omega=\omega_m*\Delta\phi_m$ and $V_D=\Delta\phi_c*k_\phi$, then the voltage output by the discriminator is defined as:

$$V_D = \frac{2Qk_\phi*\Delta\phi_m*\omega_m}{\omega_0} \qquad (14)$$

Over time, setting $s=j\omega_m(t)$:

$$V_D(s) = \left(\frac{2Q}{\omega_0}\right)*k_\phi*\Delta\phi_m(s) \qquad (15)$$

As a function of $j\omega$:

$$V_D(j\omega) = j\left(\frac{2Q}{\omega_0}\right)*k_\phi*\omega_m*\Delta\phi_m(j\omega) \qquad (16)$$

Thus, the phase of the voltage $V_D$ is 90° with respect to the modulation voltage.

The cavity discriminator shown in FIG. 4c is typically only useful over a very narrow bandwidth, but allows more de-correlation of low frequency phase modulation than the delay line discriminator and its output is always in quadrature with the excitation input. If a YIG (yttrium iron garnet) tuned cavity is substituted for the fixed narrow band cavity, broadband noise cancellation can be obtained.

Figure 5A:
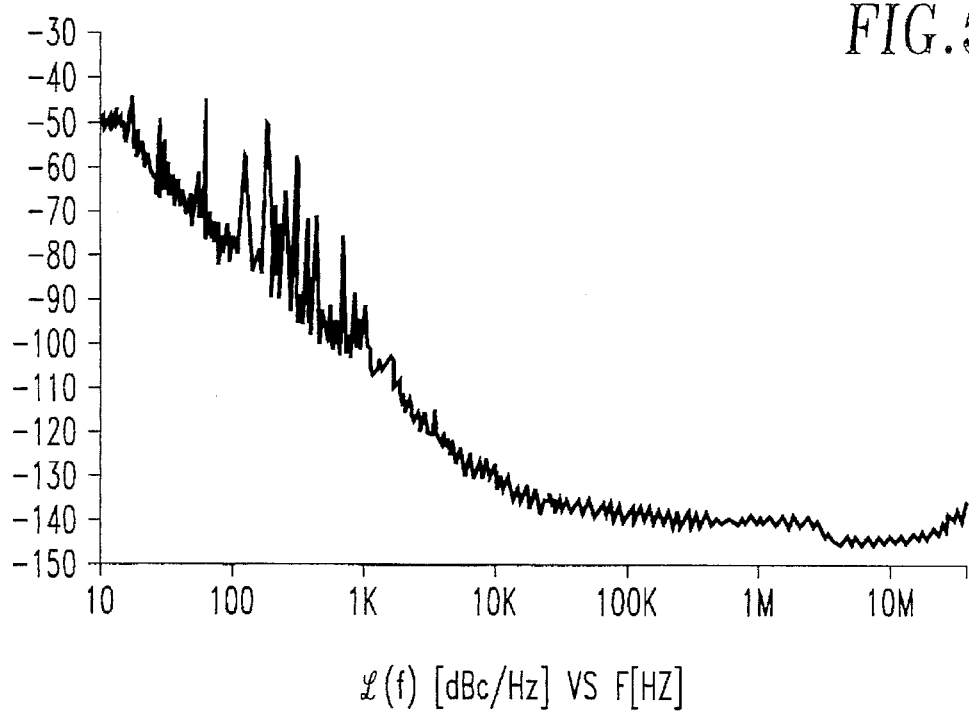
FIG. 5a shows the resulting phase noise spectrum with the feedback loop open.
Figure 5B:
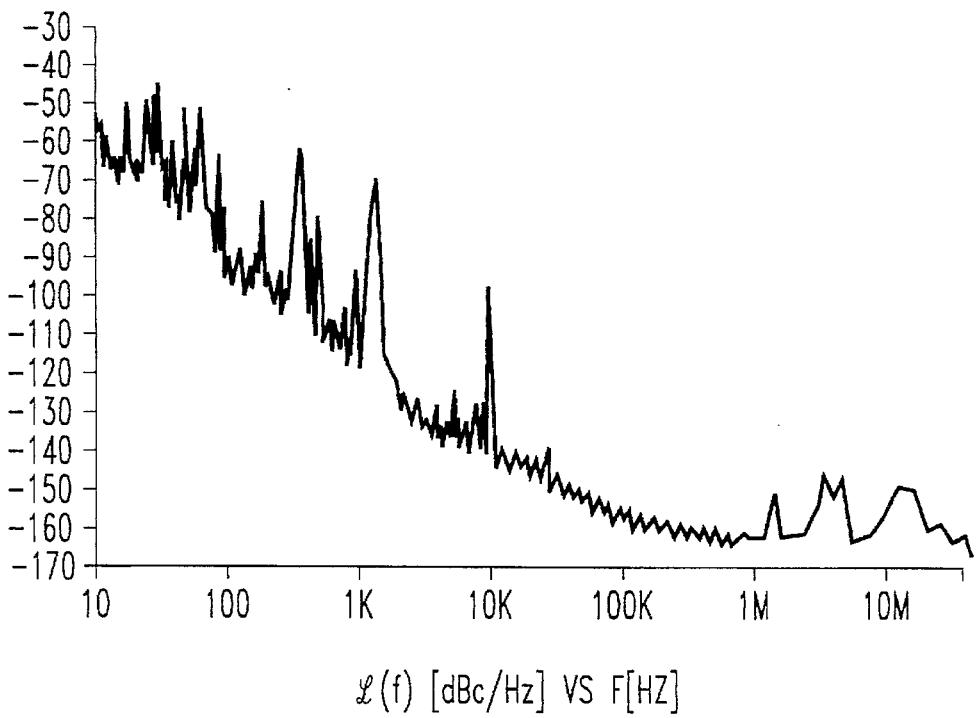
FIG. 5b shows the resulting phase noise spectrum with the feedback loop as shown in FIG. 4c closed.

FIG. 5a shows the measured result of the phase noise spectrum using a feedback loop as shown in FIG. 4c, with a narrow band 10 GHz HTS cavity and feedback to the tuning port of a 640 MHz SAWR oscillator with a feedback loop open. FIG. 5b shows the measured phase noise spectrum of the signal configuration with the loop closed and the resultant decrease in the phase noise spectrum. In both of these plots, the vertical axis is $\mathcal{L}(f)$ in dBc/Hz and the horizontal axis is $f_m$ in Hz.

For video offset frequencies at which G is less than 1, such frequencies will be the higher video frequencies of interest such as 1 MHz and beyond, the term $N\phi N_1+\phi N_2$ is not reduced. Thus, the contribution from the loop amplifier become $K_\phi N_3 AN$. The gain A of the amplifier 40 will decrease beyond some video frequencies, as determined by the loop parameters in the desired loop bandwidth, so a figure of merit will occur at the frequency at which A=1/N with the resulting phase noise contribution from the amplifier of $K_\phi N_3$. Each nanosecond of delay represents more phase shift in degrees as frequency increases.

Thus, at these higher offset frequencies, there is so much phase shift that stable feedback loops are hard to achieve. For radar applications, noise reduction at offset frequencies beyond 1 MHz is highly desirable. It is thus desirable to employ a feed forward canceller, as shown generally in FIG. 2b and described in more detail below.

FEED FORWARD CANCELLER

The feed forward noise canceller shown in FIG. 6a is capable of reducing both additive phase noise for individual components and frequency multiplied oscillator phase noise. The noise canceller is capable of wide band operation if the bridge is kept properly nulled. The bridge can be so properly nulled by using a calibration scheme or with predetermined phase shifter setting stored in a PROM.

Delay Line Discriminator

In FIG. 6a, phase noise generated by time jitter of the fundamental frequency is de-correlated by splitting the signal into two paths. One path includes a delay line 52. The other path includes a phase quadrature adjuster 53. Both paths are received by a phase detector 54. The output of the phase detector 54 is $V_D=k_\phi \times T_D \times \Delta\omega$, where $k_\phi$ is a constant determined by the choice and drive level of the phase detector 54, $\Delta\omega$ is a frequency deviation, and $T_D$ is the delay time. See the discussion regarding these parameters above.

The output of the phase detector 54 is applied through an integrating amplifier 56 to a voltage controlled phase shifter 62. The RF phase noise is attenuated by the voltage controlled phase shifter 62. The amount of noise attenuation will be determined in part by tolerances in the output voltage and amplitude and phase which can be maintained at the phase shifter tuning port.

However, there are limits which determine how much phase noise can be shaken off, i.e., producing a phase opposite in sign and equal in amplitude of the phase of the system. Such limits are determined by the phase detector 54 sensitivity $k_\phi$ in volts per radian, delay time $T_D$ in seconds, and video amplifier noise eN in nanovolts per Hz. The output of the phase shifter 54 is $V_D$, which is defined as $k_\phi \times \Delta\phi$, where $\Delta\phi$ is the phase difference between the two ports of the detector 54.

Knowing that $\Delta\phi$ equals $\Delta\omega \times T_D$, where $\Delta\omega$ is the frequency deviation of the noise side band produced by the oscillator frequency $\omega_0$ altering in phase by $\Delta\phi_M$ at a rate of $\omega_m$, it can be determined that $V_D=k_\phi \times T_D \times \Delta\omega$. The phase noise spectral density $\mathcal{L}(f)$ can then be defined as 20 log $[V_D/2k_\phi T_D \omega_m]$. In order to determine the equivalent limiting input noise spectrum to the discriminator which will produce a voltage eN at the input of the video amplifier, eN is set to equal $V_D$. The resulting noise spectral densities for values of $k_\phi$ and $T_D$ as a function of $\omega_m$ are then computed, as shown in FIGS. 7a and 7b.

Figure 7A:
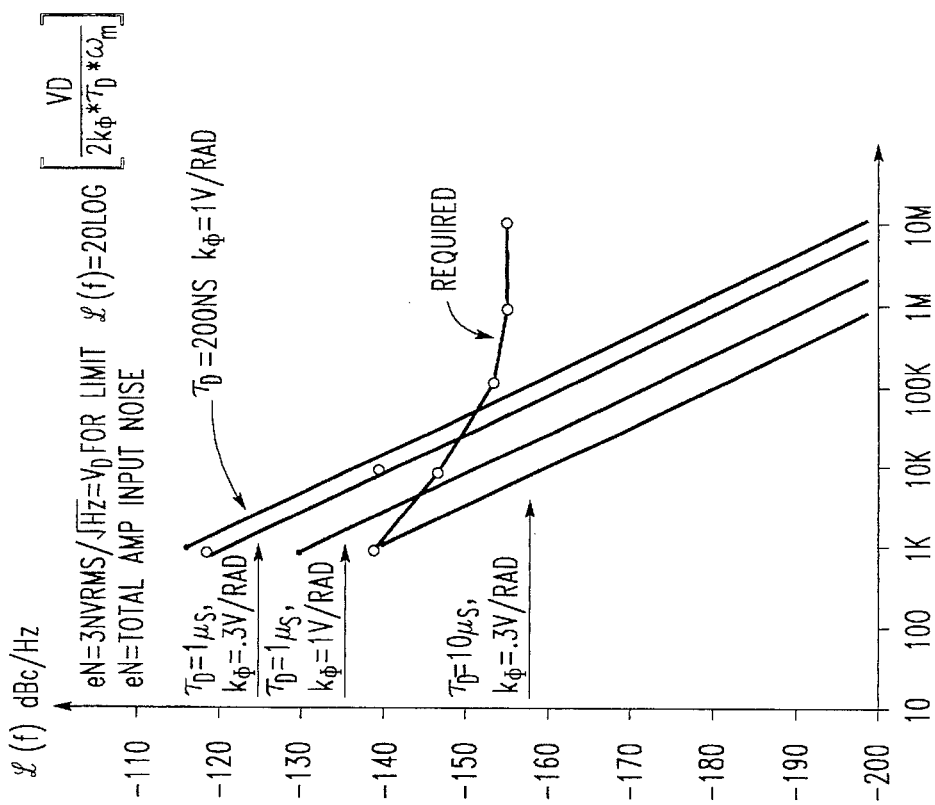
FIG. 7a shows a first example of a delay line discriminator relative to a performance curve.

FIG. 7a shows the limitation of the frequency discriminator with eN equal to 1 nanovolt per Hz and $k_\phi=1$ volt per radian for various delay times $T_D$. Obviously, better noise cancellation can be achieved with longer delay lines. A hypothetical noise curve requirement is also plotted in FIG. 7a. A 1 microsecond delay line can help reduce phase noise above 1 kHz, but a 200 nanosecond delay line can help only at modulation frequencies beyond 10 kHz.

Figure 7B:
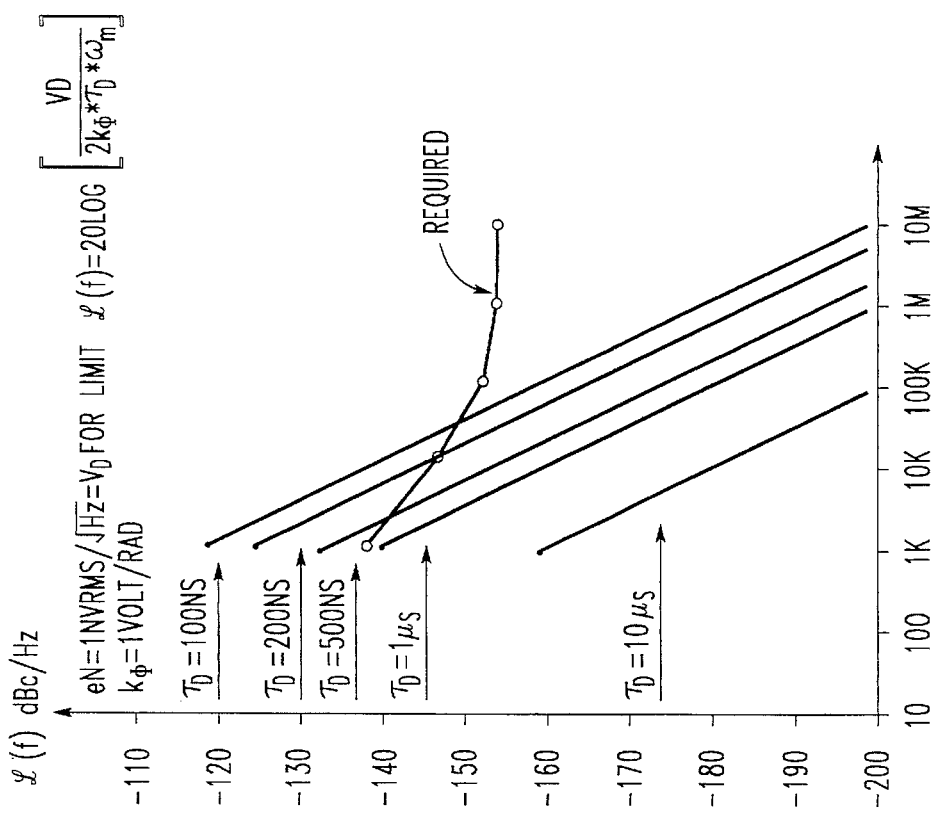
FIG. 7b shows a second example of a delay line discriminator relative to a performance curve.

FIG. 7b shows the limitations of the frequency discriminator with eN equal to 3 nanovolts per Hz and with $k_\phi$ set of either 0.3 volt per radian or 1 volt per radian, and with the same hypothetical noise requirement as shown in FIG. 7a. With the higher eN and the lower $k_\phi$, more delay time is required to meet equivalent performance of that in FIG. 7a.

There is a practical limit to the amount of time delay that can be obtained with a coil of coaxial cable, because the RF losses become too high and size becomes unacceptable. Low noise optical delay lines are the present best solution for overcoming such limitations.

If a long delay time is used in the noise canceller shown in FIG. 6a, frequency switching time will be limited. For example, a 1 microsecond delay line discriminator will take several microseconds to be fully phase settled. This limitation can be overcome by employing two or more delay line frequency discriminators, with each noise canceller excited by a separate source.

Experimental Results for Feed Forward Canceller

In order to prove the theory of operation set forth above regarding the feed forward canceller with a delay line, such a canceller was constructed in accordance with the configuration shown in FIG. 6a using a 200 nanosecond delay line built with 200 feet of low loss coaxial cable at X-band, and using a wide band operational amplifier as the integrator in the feed forward path.

Figure 7C:
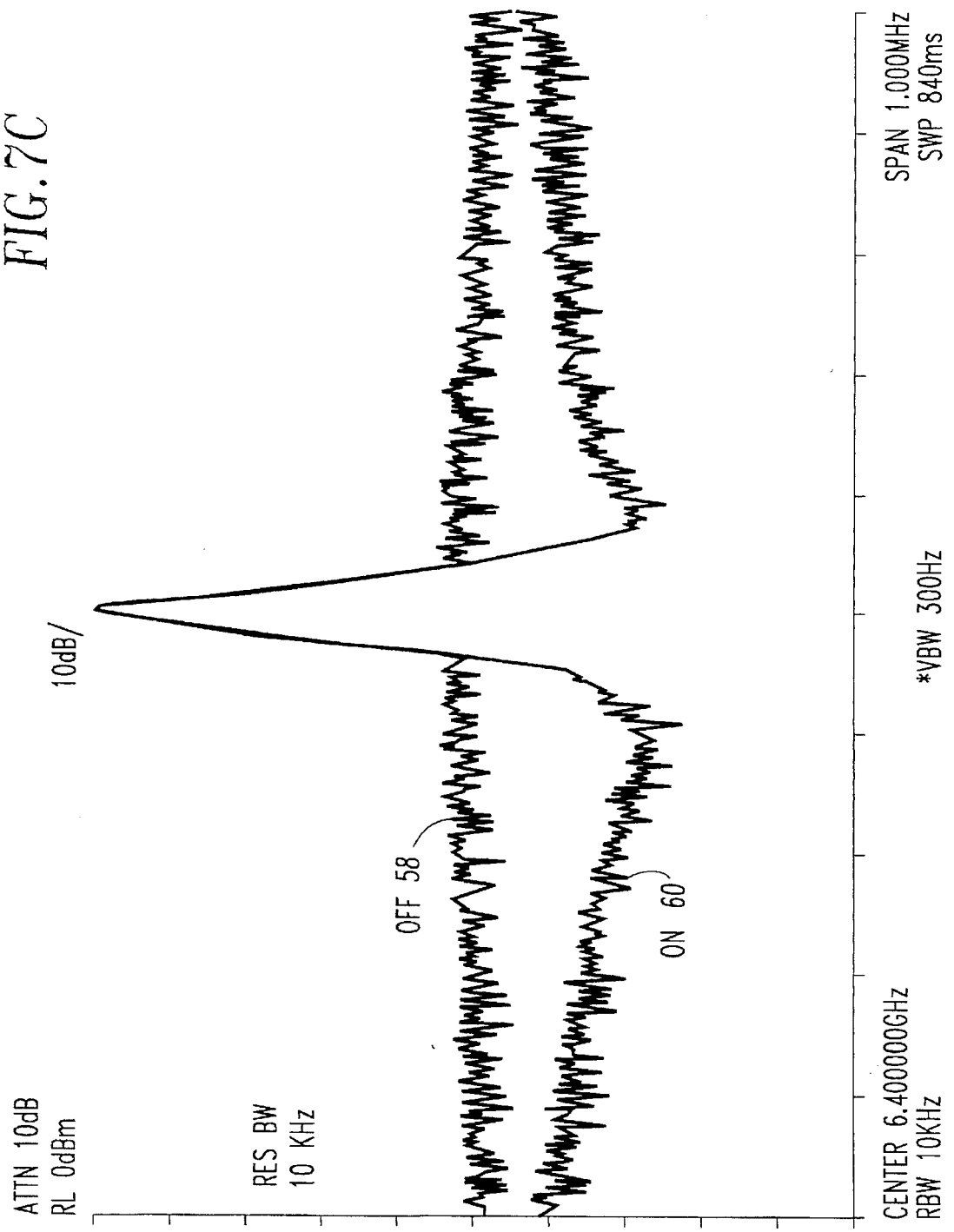
FIG. 7c shows the noise spectrum with the noise canceller both on and off.

The X-band excitation source was modulated with wide band FM noise so that wide band noise could easily be observed on the spectrum analyzer, centered at 6.4 GHz. Such a spectrum is shown as the upper spectrum 58 of FIG. 7c with the noise canceller turned off. With the noise canceller turned on, the bottom spectrum 60 of FIG. 7c resulted. The noise canceller thus reduced the close in noise spectrum by 20 dB and the further away spectrum at ±0.5 MHz by 10 dB. Clearly, the feed forward canceller concept is valid.

Feed Forward Cancelling of Multiplier Noise

Figure 9:
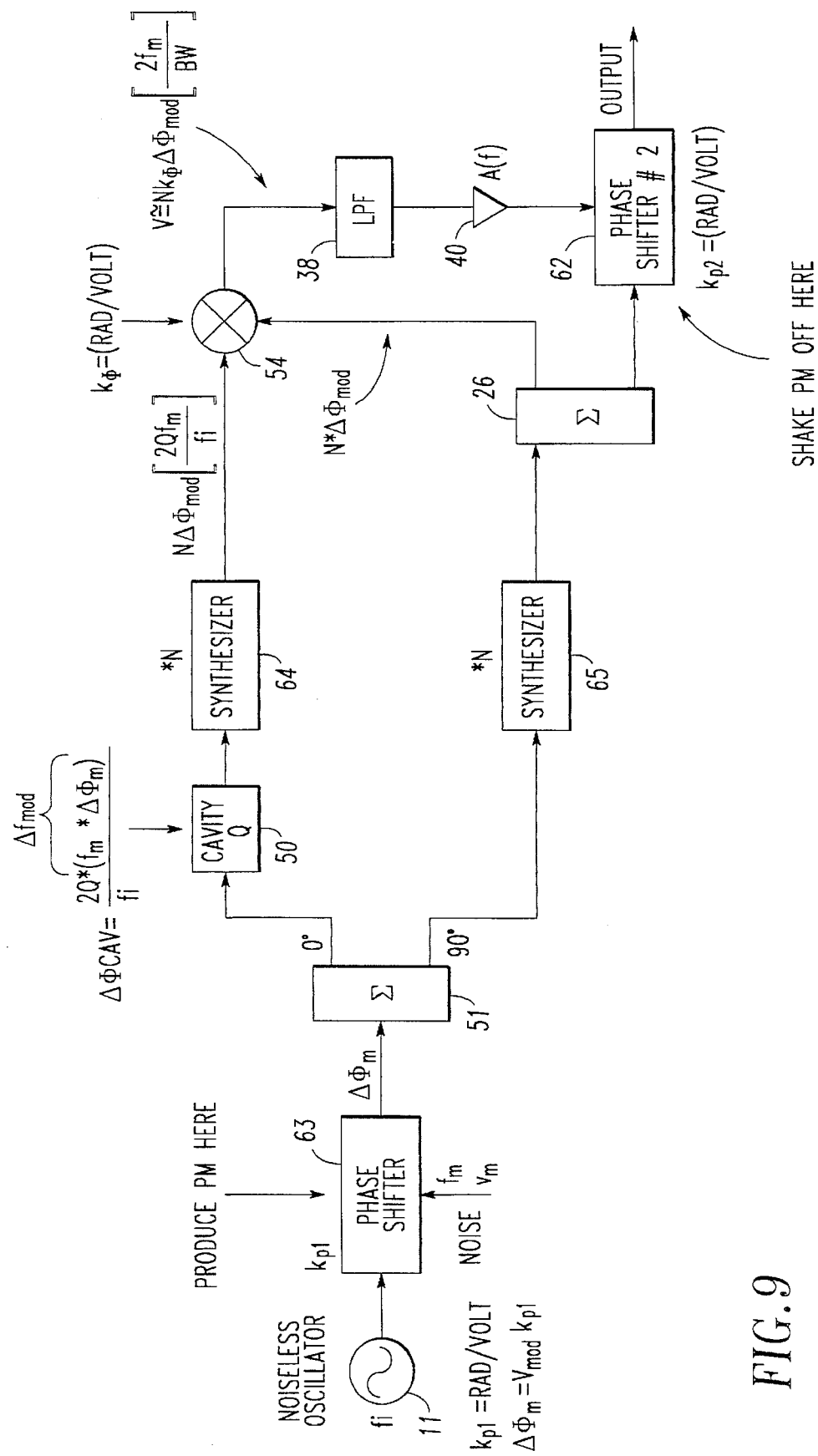
FIG. 9 illustrates a test system for a third embodiment of the feed forward canceller of FIG. 2b in which frequency multiplied oscillator noise is cancelled.

FIG. 9 shows a feed forward canceller for use with a direct frequency synthesizer 11 generating a frequency $f_i$. In a test configuration, the synthesizer 11 is noiseless and a phase shifter 63 simulates the PM/FM noise $\Delta\phi_m$ actually generated in the oscillator 10. In actual practice, this phase shifter 63 is not employed.

The purpose of the configuration shown in FIG. 9 is to cancel frequency multiplied oscillator noise, but not additive noise. In many applications, absolute optimum phase noise performance is not required. In such applications, the configuration of FIG. 9 is useful. For example, the phase noise performance of an existing radar system that has been in production for many years may want to be improved. By adding another identical synthesizer and feed back or feed forward noise cancellation of FIG. 9, the radar phase noise may be improved by 20 dB.

The purpose of the low Q cavity filter at the input of the synthesizer 64 is to de-correlate the oscillator phase noise which is input to the synthesizer 64 at the fixed frequency $f_i$. Hence, the noise output by the synthesizer 64 is also de-correlated. This output noise can then be detected by the phase detector 54 by subtracting the output noise from the noise output by the synthesizer 65 which has not been de-correlated. The advantage of this particular configuration over the delay line schemes discussed above is that the low Q single frequency filter 50 needs no tuning, and redundant, identical synthesizers can be employed.

A 90° power splitter 51 divides the modulated signal into two paths. The first path includes a cavity 50 preceding a first synthesizer 64. The output of this first synthesizer is delivered to a phase detector 54. The second path includes only a second synthesizer 65. The output of the second synthesizer 65 is split by power splitter 26, thereby delivering its output to both the phase detector 54 and a phase shifter 62. The output from the phase detector 54 then proceeds through a low pass filter 38 and an amplifier 40 to the phase shifter 62.

The phase noise from the cavity $\Delta\phi_c$ is defined as $\Delta\phi_c = 2Q(f_m)/f_i$, where $Q=f_i/BW$ and BW is the bandwidth of the cavity. Thus, if the phase detector 54 has a sensitivity of $k_\phi$ in volts/radian, it outputs a voltage $Nk_\phi \Delta\phi_m[2f_m/BW]$. The second synthesizer 65 outputs the signal $N\Delta\phi_m$. Since the output of the phase shifter 62 is to be zero, $[2k_\phi f_m/BW]A(f)k_{p2}=-1$, where $k_{p2}$ is the sensitivity of the phase shifter 62 in radians/volt. Thus, the amplifying function of the amplifier 40 is $-[BW/2k_\phi k_{p2}](1/f_m)$ such that the voltage applied to phase shifter 62 is at a phase difference of 180° and adjusted to cancel the phase modulation generated by the phase shifter 63. The phase shifter 62 is modulated at the same rate as the phase shifter 63. Such synthesizers can also be used in a feedback loop.

In order to further illustrate the value of the third embodiment of the feed forward canceller of the present invention shown in FIG. 9, Table 1 below indicate some typical limitations of this configuration. Assuming that the phase detector has a sensitivity $k_\phi$ of 1 V/radian and the broadband amplifier at the phase detector output has an equivalent input noise voltage of 1 nv rms/√Hz with a flat noise spectrum. Setting the phase detector output voltage equal to the amplifier input noise to determine the resulting $\Delta\phi_m$ which then has an equivalent $\mathcal{L}(f)$ as a limiting value Assuming N=100, Q=2.25, $f_f=10^6$ Hz and the cavity bandwidth is 44.44 MHz, the results shown in Table 1 are obtained.

TABLE 1

| $f_m$ | $\Delta\phi_m$ (rad) | L(f) |
| --- | --- | --- |
| 1 KHz | 3.143·10$^{-7}$ | −136 dBc/Hz |
| 10 KHz | 3.143·10$^{-8}$ | −156 dBc/Hz |
| 100 KHz | 3.143·10$^{-9}$ | −176 dBc/Hz |
| 1 MHz | 3.143·10$^{-10}$ | −196 dBc/Hz |

These are excellent results. If the low modulation frequency performance must be improved, at least one of the following must be achieved: narrowing the cavity bandwidth, increasing the number of cavity poles, increasing the phase detector sensitivity, and/or decreasing the amplifier noise.

In the configuration of FIG. 9, the additive phase noise is less than the frequency multiplied phase noise. Thus, it is sufficient that only the frequency multiplied phase noise be eliminated.

Cancelling Amplifier Noise

The circuit shown in FIG. 9 can be modified by removing the synthesizer 64 and the cavity filter 50 from the bridge and replacing the synthesizer 65 with an amplifier 61 to measure the additive phase noise of the amplifier 61. The PM noise source at the output of the amplifier represents the internally generated phase noise within the amplifier. A spectrum of this phase noise will be a function of the offset modulation frequency. The coupler 17 couples the output from the amplifier 61 to the detector 54. An advantage of this mechanization, which is shown in FIG. 13, over that of FIG. 9, is that the phase detector output voltage is independent of the noise modulation frequency. In FIG. 9, the phase detector voltage is proportional to the frequency deviation. Hence, no potential frequency response tailoring will be required at the video amplifier for the mechanization in FIG. 13.

ELIMINATION OF PERIODIC RESPONSE

Another factor which must be considered is periodic response of the delay line frequency discriminator, for either feed back or feed forward configurations. Such discriminators have zero response at harmonics of modulation frequencies equal to (1/$T_D$). Thus, a microsecond delay line will have zero responses at 1 MHz, 2 MHz, etc.

Such limitations can be overcome by summing the responses of two or more discriminator circuits to a common integrating amplifier 56 as shown in FIG. 6b. A power splitter 51 divides the input signal into three paths. A first path proceeds directly to the phase shifter 62. A second path proceeds to a first discriminator 25 which includes a power splitter 26, a path including a delay line 52 and a path including a phase quadrature adjuster 53. The signals from these paths are detected by a phase detector 54, which output a detected voltage $V_{D1}$ to the integrating amplifier 56.

Similarly, a third path from the power splitter 51 proceeds to a second discriminator 25'. Similarly to the first discriminator 25, the second discriminator 25' includes a power splitter 26', a path including a delay line 52' and a path including a phase quadrature adjuster 53'. The signals from these paths are detected by a phase detector 54', which output a detected voltage $V_{D2}$ to the integrating amplifier 56.

Delay times are chosen to be different for each discriminator so that the composite total response has a minimum number of zeros. In the example shown in FIG. 6b, the discriminators 25 and 25' have delay of 300 nanoseconds and 200 nanoseconds, respectively. Zero responses for the 200 nanosecond delays occurred harmonics at 5 MHz while the zero responses for the 300 nanosecond delay occurred harmonics of the 3.3 MHz. Hence, useful noise de-correlation can be obtained up to an offset frequency of approximately 9 MHz. If noise improvement above 1 MHz is really not required, a feedback arrangement, such as the one shown in FIGS. 4a–4c, which have higher tolerance to phase detector $V_D$ voltage variations is probably more desirable.

Figure 8:
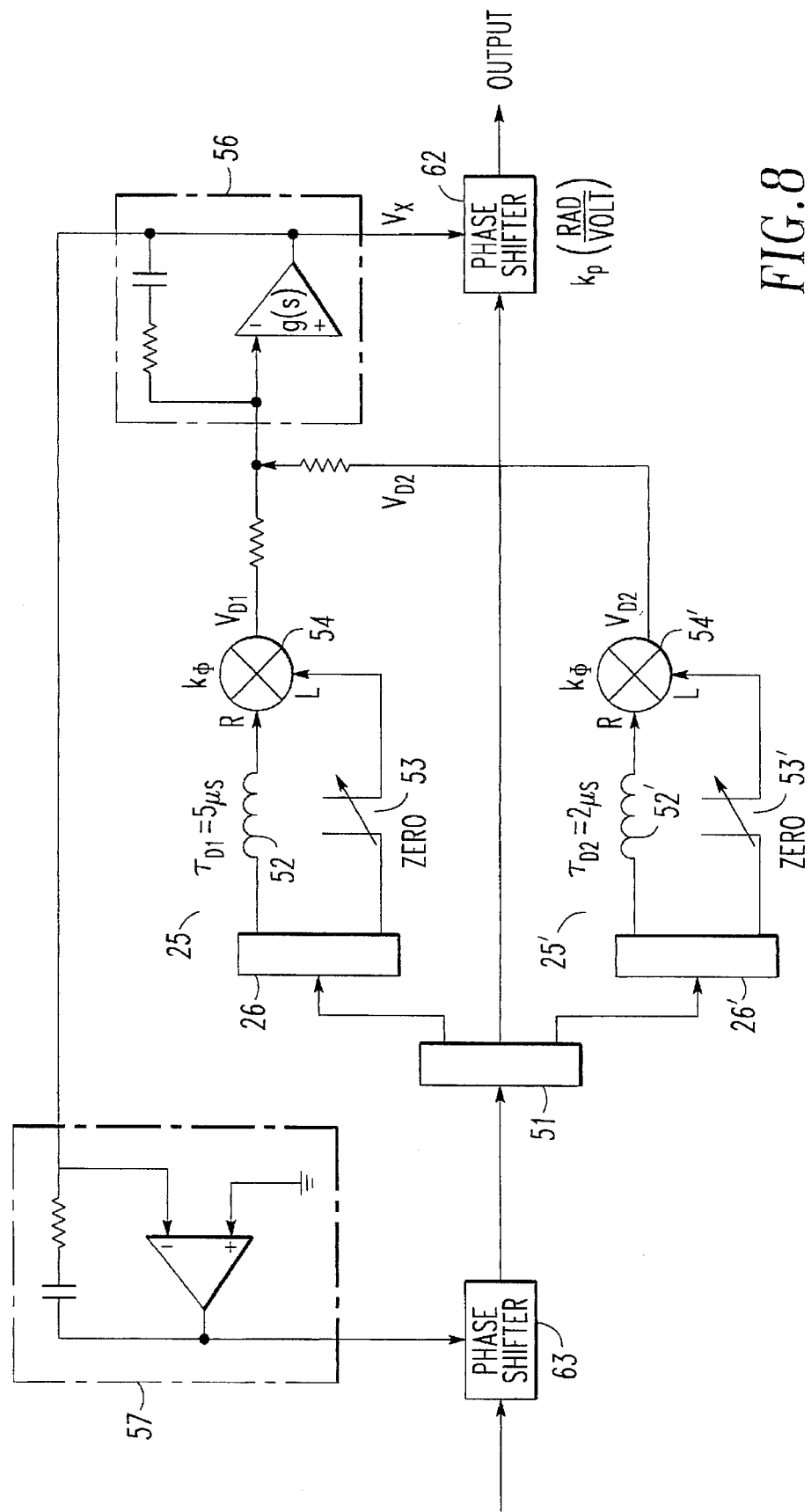
FIG. 8 illustrates another embodiment of the present invention including both a feed forward and a feedback noise canceller.

Alternatively, the two frequency discriminators 25 and 25' may form both a feed forward canceller and a feedback canceller as shown in FIG. 8. Again, the delays within the respective discriminators are different. In the particular example shown in FIG. 8, the delay in the discriminator 25 is 5 µsec and the delay in the discriminator 25' is 2 µsec.

These discriminators 25 and 25' are the same as those shown in FIG. 6b. However, an additional phase shifter 63 is inserted prior to the power splitter 51. The common integrating amplifier 56 now outputs the voltage $V_X$ to both the phase shifter 62 and to a feedback integrating amplifier 57, which controls the phase shifter 63.

CALIBRATION OF DISCRIMINATORS

Figure 10:
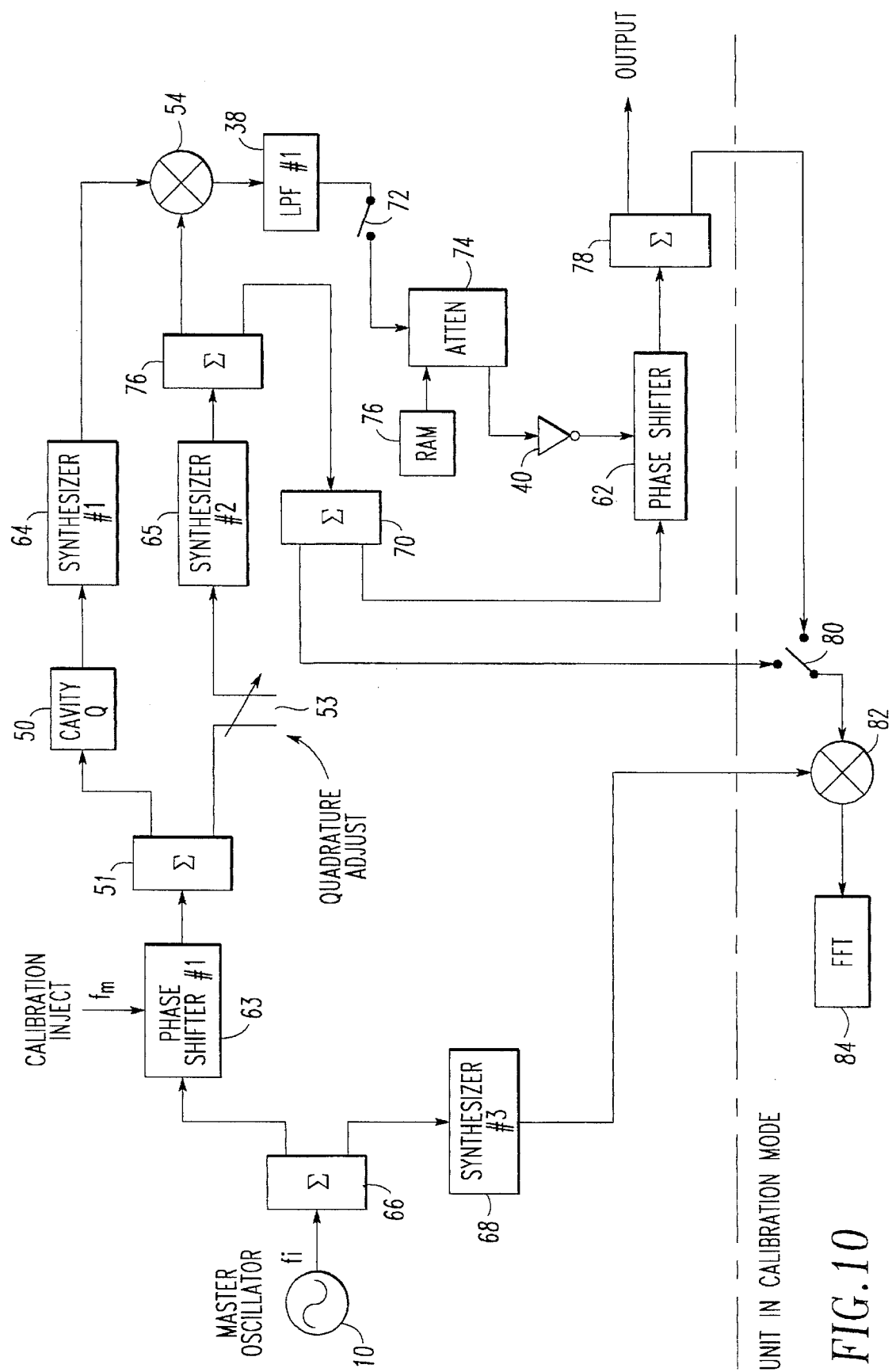
FIG. 10 illustrates a calibration scheme using the configuration shown in FIG. 9.

FIG. 10 illustrates calibration of the feed forward phase canceller of the present invention used in conjunction with the configuration shown in FIG. 9. In order to properly null the phase noise, the gain between the phase detector 54 and the phase shifter 62 must be properly adjusted by a voltage controlled attenuator 74. A random access memory circuit, RAM 76, is included to provide calibration over time, temperature and frequency.

The output of the oscillator 10 is output to both a phase shifter 63 and a third synthesizer 68 via a power splitter 66. The third synthesizer 68 supplies a signal to a calibration phase detector. Calibration is achieved by injecting a very small signal $f_m$ modulation, e.g., 100 kHz, at the phase shifter 63. A phase quadrature adjuster is provided prior to the second synthesizer 65. A power splitter 26 outputs the signal from the second synthesizer 65 to both the phase detector 54 and another power splitter 70. The power splitter 70 in turn outputs this signal to the phase shifter 62 and to the calibration equipment, in particular, to a switch 80.

The voltage output by the phase detector 54 passes through the low pass filter 38 through a switch 72 to the voltage controlled attenuator 74 controlled by the RAM 76. The attenuated signal is then amplified by the amplifier 40 and passed to the phase shifter 62. The clean signal output from the phase shifter 62 is provided via a power splitter 78 to the output and to the calibration switch 80. The calibration switch supplies the appropriate signal to the calibration phase detector 82. The output of this phase detector 82 is provided to a Fast Fourier Transform (FFT) circuit.

The FFT circuit can actually be the signal processor in the radar receiver, or it can simply be a spectrum analyzer. The FFT and phase detector below the dotted line in FIG. 10 provides a simplified version of the radar or communication system.

The calibration process involves the nulling of the $f_m=100$ kHz calibration signal generated by the phase shifter 63 in the FFT. The switch 72 or the switch 80 allows the depth of the null achieved by the noise canceller to be measured. Only one switch of switches 72, 80 is needed. If the radar or communication receiver is not used in the calibration procedure, a spectrum analyzer may be substituted.

A similar calibration scheme is required for the feed forward techniques of FIGS. 6a, 6b and 8. Again, an extra synthesizer is required for the calibration procedure.

CANCELLATION OF NOISE FROM FREQUENCY DIVIDERS

Figure 11:
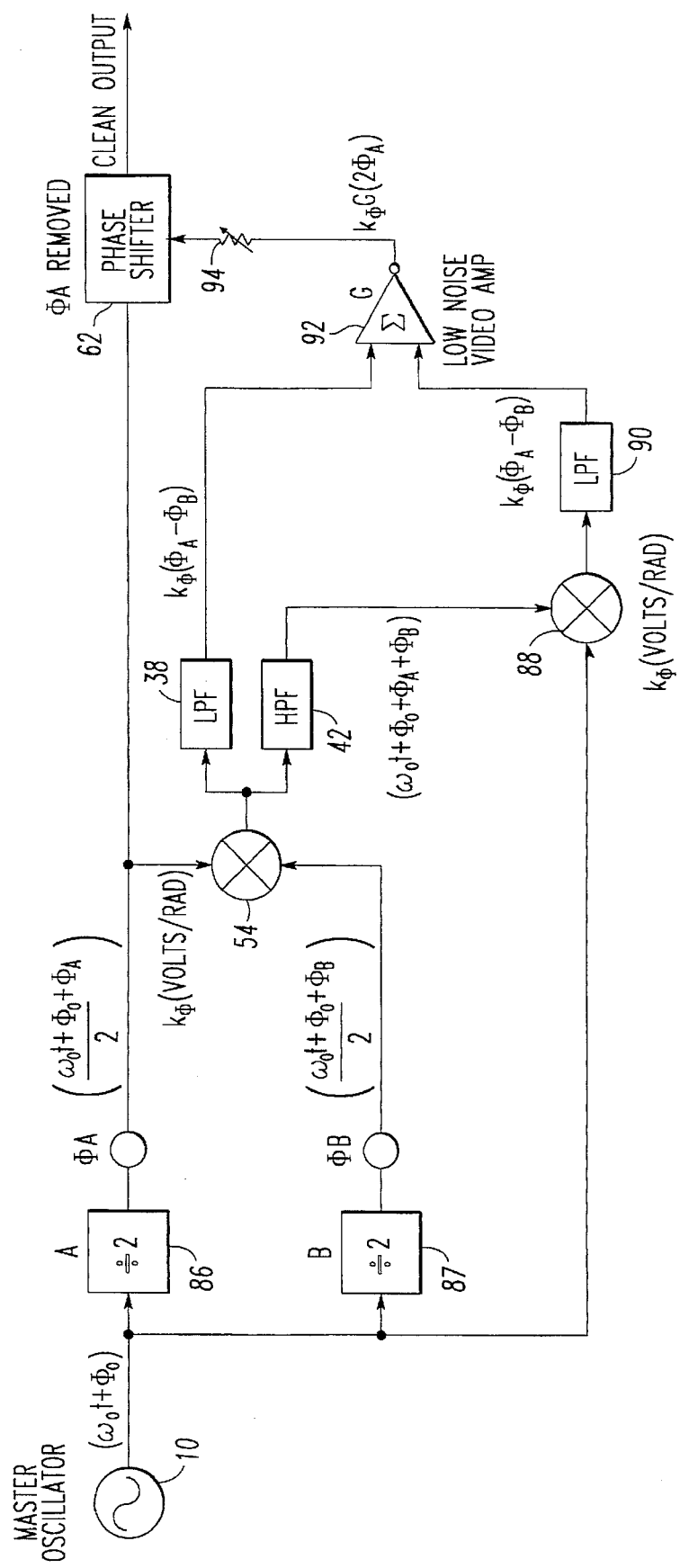
FIG. 11 illustrates an embodiment of the phase noise canceller of the present invention when the frequency multiplier is a frequency divider.

FIG. 11 illustrates how to cancel additive phase noise when the frequency multiplier is a frequency divider. Regenerative dividers are limited in frequency and have numerous unstable regions. However, dividers with noise cancellation have no such limitations.

The example shown in FIG. 11 consists of two divide by two dividers 86, 87 driven by a common source 10. An output of each divider 86, 87 drives an input port of a phase detector 62. The phase detector 62 has two outputs, $k_\phi(\phi_A-\phi_B)$ and $(\omega_0 t+\phi_0\phi_A+\phi_B)$. A low pass filter 64 passes the former portion to a low noise video amplifier 72. The latter portion of the output from the detector 62 is passed via a high pass filter 42 to another detector 88 where it is mixed with the signal from the master oscillator 10. This mixed signal is then passed through a low pass filter 90 to output $k_\phi(\phi_A+\phi_B)$ to a low noise video amplifier 72. The output of this low noise video amplifier 72 is proportional to the phase noise spectrum $\phi_A$ which is then removed by a variable resistor 94 and the phase shifter 62 for a clean output.

Such a concept can be expanded to deal with any divide number which is a multiple of two by simply inserting an appropriate multiplier (e.g., equal to the power of two by which the signal is divided by dividers 86, 87) in between the high pass filter 42 and the detector 88. Thus, the original signal from the oscillator will cancel with the signal output from the detector 62. Further, a divider is inserted between the detector 88 and the amplifier 92 so that the phase shift due to divider 87 will be eliminated in the output of the amplifier 92. For example, if the dividers 86, 87 are divide by 4, the output from the high pass filter 42 will be multiplied by 2 such that the output of the detector 88 is $k_\phi 2(\phi_A+\phi_B)$. This factor of 2 is then eliminated by the divider between the detector 88 and the amplifier 92 so that the contribution of $\phi_B$ may be eliminated by the amplifier 92.

FIG. 12 shows how the additive phase noise $\phi_A$ of a single frequency divider of ratio N can be cancelled with feed forward nulling. A portion of the divider's output is used to drive a low noise frequency multiplier of ratio N which drives one port of a phase detector. The other port of the phase detector is a video voltage proportional to the additive phase noise spectrum of the divider. Hence, with feed forward nulling, the additive phase noise of the frequency divider can be cancelled. Since the additive phase noise of commercially available times two multipliers has been measured to have $\mathscr{L}(f)$ better than −180 dBc/Hz floors, such multipliers are not a limiting factor in noise cancellation. The additive phase noise of a frequency divider can also be cancelled with feed back.

CONCLUSION

The ability to null small amounts of phase noise will be limited by the phase detector sensitivity and by the equivalent input noise of the video amplifier and noise of the Schottky diodes in the phase detector. Setting the phase detector output voltage equal to the amplifier input noise to determine the resulting $\Delta\phi$ which then has an equivalent $\mathscr{L}(f)$ as a limiting value. If $k\phi=1$V/rad and the amplifier input noise is 1nV/√Hz, then $\mathscr{L}(f)=-183$ dBc/Hz. Good phase and amplitude tolerances on the nulling video voltage to the phase shifter are required to get good FM noise suppression.

The phase noise cancellers of the present invention provide signals having phase spectral densities exceeding −170 dBc/Hz. By canceling the noise of the entire system, further improvements to the noise generated by the individual components themselves are not needed.

The invention being thus described, it will be obvious that the same may be varied in many ways. For example, it is evident that a delay line may be replaced with a cavity, and vice versa, in the various configurations in accordance with system requirements. Such variations are not to be regarded as a departure from the spirit and scope of the invention, and all such modifications as would be obvious to one skilled in the art are intended to be included within the scope of the following claims.

What is claimed is:

1. A phase noise compensated oscillator comprising:
   an oscillator;
   a frequency multiplier which multiplies a signal output by said oscillator; and
   a noise cancelling circuit for cancelling phase noise contributions from said oscillator and said frequency multiplier.

2. The phase noise compensated oscillator as recited in claim 1, wherein said noise cancelling circuit includes a feedback loop.

3. The phase noise compensated oscillator as recited in claim 2, wherein said feedback loop includes a frequency delay line.

4. The phase noise compensated oscillator as recited in claim 2, wherein said feedback loop includes a delay cavity.

5. The phase noise compensated oscillator as recited in claim 1, wherein said noise cancelling circuit includes a feed forward loop.

6. The phase noise compensated oscillator as recited in claim 5, wherein said feed forward loop includes a frequency delay line.

7. The phase noise compensated oscillator as recited in claim 5, wherein said feed forward loop includes a delay cavity.

8. The phase noise compensated oscillator as recited in claim 1, wherein said frequency multiplier includes two dividers.

9. The phase noise compensated oscillator as recited in claim 1, wherein said noise cancelling circuit further cancels noise contributions from sources other than said oscillator and said frequency multiplier.

10. The phase noise compensated oscillator as recited in claim 1, wherein said noise cancelling circuit includes:
    a first power splitter splitting a signal output from said frequency multiplier into a first and a second branch;
    a single frequency filter in said first branch of said first power splitter;
    identical synthesizers in both said first and said second branch of said power shifter;
    a second power splitter receiving an output from said second branch of said first power splitter;
    a phase detector; and a phase shifter outputting a noise reduced signal, wherein an output of said first branch is provided to said phase detector, an output of said second branch is supplied to said phase detector and said phase shifter, and an output of said phase detector is supplied to said phase shifter.

11. The phase noise compensated oscillator as recited in claim 1, wherein said noise cancelling circuit includes:

a power splitter splitting a signal output from said frequency multiplier into a first and a second branch;

an amplifier inserted in said first branch;

a phase detector receiving an output of said first branch and an output of said second branch; and a phase shifter, receiving said output of said first branch and an output of said phase detector, and outputting a reduced noise signal.

12. A method of reducing phase noise from an oscillator, comprising the steps of:

generating a master signal;

frequency multiplying said master signal; and cancelling phase noise contributions from said generating step and said frequency multiplying step.

13. The method as recited in claim 12, wherein said cancelling step includes feeding back a phase noise signal to said generating step.

14. The method as recited in claim 12, wherein said cancelling step includes feeding forward said phase noise signal forward to a phase shifter.

15. The method as recited in claim 12, wherein said cancelling step comprises splitting said frequency multiplied signal into two paths, introducing a delay into one of said two paths, and determining a phase difference between signals output from said two paths.

16. The method as recited in claim 15, wherein said cancelling step further comprises feeding said phase difference back to said generating step.

17. The method as recited in claim 15, wherein said cancelling step further comprises feeding said phase difference forward to a phase shifter.

18. The method as recited in claim 12, further comprising calibrating said cancelling step including, supplying a signal from a synthesizer to a calibration phase detector, and switching between providing a signal having a small signal modulation and a clean signal to said calibration phase detector.

19. The method as recited in claim 12, further comprising reducing periodic response of said cancelling step including performing said cancelling step at different delay times and forming a composite response from said performance at said different delay times.

20. The method as recited in claim 12, wherein said cancelling step further includes cancelling additive phase noise from sources other than said generating step and said frequency multiplying step.

* * * * *